US006940366B2

(12) United States Patent
Komiya

(10) Patent No.: US 6,940,366 B2
(45) Date of Patent: Sep. 6, 2005

(54) COIL FILTER AND METHOD FOR MANUFACTURING THE SAME

(76) Inventor: Kunifumi Komiya, 12-8-202, Sugita 2-chome, Isogo-ku, Yokohama-shi, Kanagawa 235-0033 (JP)

( * ) Notice: Subject to any disclaimer, the term of this patent is extended or adjusted under 35 U.S.C. 154(b) by 0 days.

(21) Appl. No.: 10/479,613

(22) PCT Filed: Oct. 25, 2001

(86) PCT No.: PCT/JP01/09414

§ 371 (c)(1),
(2), (4) Date: Dec. 4, 2003

(87) PCT Pub. No.: WO02/101764

PCT Pub. Date: Dec. 19, 2002

(65) Prior Publication Data

US 2005/0046521 A1 Mar. 3, 2005

(30) Foreign Application Priority Data

Jun. 6, 2001 (JP) ...................................... 2001-171745

(51) Int. Cl.[7] ............................ H03H 7/00; H01F 27/28
(52) U.S. Cl. ....................................... 333/181; 336/192
(58) Field of Search .......................... 333/12, 181, 202, 333/219; 336/174, 175, 177, 196, 199, 200, 192

(56) References Cited

U.S. PATENT DOCUMENTS 4,549,042 A * 10/1985 Akiba et al. ............ 174/114 R
6,121,866 A * 9/2000 Maruyama .................. 336/192
6,529,109 B1 * 3/2003 Shikama et al. .............. 336/83
6,633,219 B2 * 10/2003 Marbach et al. ............ 336/177
2004/0075515 A1 * 4/2004 Kyogoku et al. ............. 336/12

FOREIGN PATENT DOCUMENTS

JP 06119827 A * 4/1994 ............ H01B/7/34
JP 07045446 A * 2/1995 ........... H01F/27/06
JP 09326317 A * 12/1997 ........... H01F/27/00

OTHER PUBLICATIONS

Japanese Utility Model Application, Laid–open No. 55–169817, Dec. 5, 1980.*
Japanese Utility Model Application, Laid–open No. 05–6812, Jan. 29, 1993.*

* cited by examiner

*Primary Examiner*—Seungsook Ham
(74) *Attorney, Agent, or Firm*—Lowe Hauptman & Berner, LLP

(57) ABSTRACT

The present invention provides a coil filter suitable for surface mounting on an electronic circuit board by automatic mounting and capable of realizing wide band isolation excellent in high-frequency characteristics without requiring consideration for the mutual position of parts. The coil filter functions to block electromagnetic waves or high-frequency signals propagating while being superimposed on a DC power supply, signal, or the like of an electronic apparatus such as an electronic circuit board. Conducting wires are bonded electrically at coil end parts such that a conducting wire part wound by one turn or more constitutes a short ring conducting in a ring shape on both sides of an intermediate part in which electrically insulated conducting wires are wound. End parts of the conducting wire are positioned on the inner side of the outermost circumferential part of the coil-shaped end faces.

19 Claims, 5 Drawing Sheets

PRIOR ART PRIOR ART (a) (b)

PRIOR ART PRIOR ART (a)

COIL FILTER AND METHOD FOR MANUFACTURING THE SAME

DETAILED DESCRIPTION OF THE INVENTION

1. Field of the Invention

The present invention relates to a coil filter that is surface-mounted on a circuit board in an electronic device for blocking electromagnetic waves, high-order harmonics, or high-frequency signals that become superimposed on and propagated along with a DC power supply, signals, or the like from the electronic device; and also to a method for manufacturing the coil filter.

2. Description of the Related Art

As electronic equipment has become lighter and more compact in recent years, progress has been made in miniaturizing parts used in the equipment and automatically mounting these small parts. Further, various chip-type inductors supporting surface mounting have been devised and are currently being used as inductor parts.

These chip-type inductors include thick-film conductors formed on a ceramic or ferrite green sheet in a layered construction that are formed and fired, electrodes formed in a coil shape using a technique to form thick-film or thin-film conductors on a ceramic or ferrite substrate, coil-shaped inductors formed by metalizing a conductor on a chip-type base material and cutting the conductor with a laser or the like, and a leadless inductor formed in a chip shape having a film of copper wire wound in a squared pattern on an insulator formed of ferrite, ceramic, or the like.

However, the effects of packaging in these types of structures and the structure-related stray capacitance, parasitic capacitance, and the like lead to limitations in the operating frequency range, a deficiency in current capacity due to the large conducting resistance, or problems in magnetic saturation, Q-value, or insertion loss.

When using inductors in transmitters requiring low loss, impedance matching of antennas, power sources with large currents, and the like, coils configured of a simple wound conducting wire are necessary. Coils formed of a wound conducting wire may be configured with a ceramic core, a magnetic core formed of ferrite or the like, an air core, or the like, depending on the application.

High harmonic noise that becomes superimposed on the power source, digital signals, or the like of the electronic circuit board and noise called electromagnetic interference (EMI), in which electromagnetic waves leak from the power source, digital signals, or the like, are generally treated by inserting resistors, grounding with capacitors, or the like. Due to their properties, coils are also often used when the requirements for voltage drop and fluctuations in DC level are severe.

However, most coils have a resonance point for distributed capacitance. The resonance point is generally at the threshold frequency for using the inductor. Further, the coil may transform into an antenna at a specific frequency, generating the opposite effect of the EMI countermeasure. Digital equipment in particular must be used with care when high-order harmonics are generated over a wide band. Further, care must be also given to magnetic coupling between coils caused by magnetic flux, and the ground plane of the circuit board. When mounting coils, it is important to consider the orientation of the coil and its polarity and to avoid nearby circuit patterns.

Further, for coils having the simple construction of a wound conducting wire, problems have occurred in the shape and processing of soldered parts on both ends of the coil that are used as terminals (electrodes) for connecting the coil to the circuit. Various devices have been attempted in an attempt to facilitate handling of the coils with an automatic mounter, including forming as many soldered parts on the coil ends as possible, so that the soldered parts nearly span the entire periphery, and forming terminals that are level at points of contact with the circuit board. However, in tape and reels that accommodate plastic embossed areas, the edges of the cut surface of the conducting wire on the end portions of the coil can catch on the inner surface of the plastic embossed tape, causing a decrease in the yield rate.

In view of the foregoing, it is an object of the present invention to provide a coil filter having a coil shape suitable for surface mounting on a circuit board in electronic equipment using an automatic mounter and capable of realizing a wide band isolation excellent in high-frequency characteristics without requiring consideration for the mutual position of parts. The coil filter should be thus capable of preventing electromagnetic waves, higher harmonics, high-frequency signals, and the like from propagating in a superimposed state with a DC power source, signals, or the like. It is another object of the present invention to provide a method for manufacturing the coil filter.

DISCLOSURE OF THE INVENTION

These objects will be attained by a coil filter for blocking electromagnetic waves or high-frequency signals propagating while being superimposed on a DC power supply, signal, or the like of an electronic apparatus such as an electronic circuit board, wherein conducting wires are bonded electrically at coil end parts such that a conducting wire part wound by one turn or more constitutes a short ring conducting in a ring shape on both sides of an intermediate part in which electrically insulated conducting wires are wound, and end parts of the conducting wire are positioned on the inner side of the outermost circumferential part of the coil-shaped end faces.

Further, the conducting wire in the intermediate part is wound in a multiple or multilayer coil shape.

Further, the conducting wire part of the coil end parts constitutes a short ring in which conducting wires are electrically bonded by soldering or welding.

Further, an insulating coating is formed over the conducting wire among the adjacent conducting wires in the intermediate part; and the coil end parts constituting the short ring are subjected to a plating process by solder or metal.

Further, the coil filter is configured to obtain desired characteristics by setting the short ring part of the coil end parts to a desired number of turns greater than or equal to one turn and within a maximum number of turns.

Further, the external shape of the coiled conducting wire including electrode parts configuring the short rings is formed cylindrical in shape to facilitate mounting on an electronic circuit board or the like.

Further, a core material formed of a magnetic material or a rod-shaped core is disposed inside the coiled conducting wire.

Further, a core material formed of a magnetic material is disposed inside the coiled conducting wire; and the core material is disposed inside the short ring parts configured on the coil end parts.

Further, the end parts of the conducting wire are positioned on the inner side of the outermost circumferential part of the coil shape, such that the core material formed of magnetic material or the rod-shaped core disposed inside the coiled conducting wire does not fall out.

Further, the coiled conducting wire is configured of a litz wire in which a plurality of conducting wires covered with individual insulating coatings are twisted together.

Further, a core material formed of a magnetic material or a rod-shaped core is disposed inside the coil shape formed by the litz wire; and a short ring is configured by welding end parts of the litz wire at a plurality of locations to a conducting ring formed on both end parts of the core material.

Further, the conducting wire is wound in a coil shape, and subsequently a core material formed of a magnetic material or a rod-shaped core having an outer diameter equivalent to or smaller than the inner diameter of the coil is inserted into the coil.

BRIEF DESCRIPTION OF THE DRAWINGS

In the drawings:

FIG. 1(*b*) is a side view of the coil filter;

FIG. 2(*b*) is a side view of the coil filter;

FIG. 3(*b*) is a side view of the coil filter;

FIG. 4(*b*) is a side view of the coil filter;

FIG. 5(*b*) is a side view of the inductor;

FIG. 6(*b*) is a side view showing the inductor;

FIG. 7(*b*) shows the impedance characteristics of an air-core coil.

FIG. 8(*b*) shows the isolation characteristics for a common induction coil.

BEST MODE FOR CARRYING OUT THE INVENTION

A coil filter according to preferred embodiments of the present invention will be described while referring to the accompanying drawings.

Figure 1A:
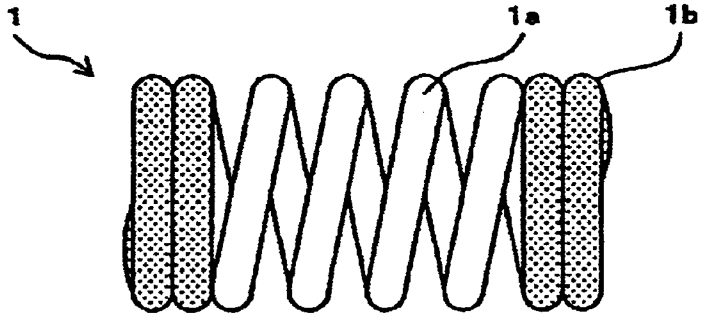
FIG. 1 (*a*) is a front view of the coil filer showing the share of a coil filter according to a first embodiment of the present invention.
Figure 1B:
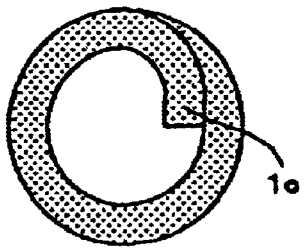

FIG. 1 is a schematic view showing the shape of a coil filter according to a first embodiment of the present invention.

FIG. 1(*a*) shows a front view and FIG. 1(*b*) shows a side view of the coil filter 1. A conducting wire of a thickness suitable for the intended application is wound in a coil shape, while maintaining a fixed pitch in a center part to electrically insulate adjacent conducting wires 1*a*. The conducting wire is electrically joined with end parts 1*b*, which configure short rings for interrupting magnetic flux in the coil. End parts 1*c* of the conducting wire are positioned on the inner side of the outermost circumferential part of the coil-shaped end faces. While not shown in the drawings, the end parts 1*c* undergo a bonding process through spot welding, laser soldering, or the like to ensure an electrical connection and configure a reliable short ring prior to mounting.

By positioning the end parts 1*c* of the conducting wire on the inner side of the outermost circumferential part of the coil-shaped end faces in this way, mounting efficiency is greatly improved over the conventional formation in which the conducting wire is simply cut and thus can catch on the inner surface of the plastic embossed carrier used in the automatic mounter.

By configuring the conducting wire with short rings, the characteristics of the conducting wire will deviate from the original conductor characteristics in impedance matching or resonance circuit applications, but will improve the effects of an EMI filter, such as a ferrite bead inductor. For common inductors, it is necessary to consider not only the mutual arrangement of parts with respect to magnetic flux, but also the effects of ground patterns and, in some cases, polarity. However, the coil filter of the present invention, which is configured with short rings, allows a great degree of freedom in parts arrangement since there is almost no need to consider the effects of leakage flux, as with inductors having a closed magnetic path. Accordingly, when greater isolation is required, it is possible to achieve the desired characteristics by connecting coil filters in multiple stages.

For its low cost and simplicity, spot welding is often used for assembling electronic parts. A plurality of materials to be welded is interposed between two electrodes, and voltage pulses are applied. The heat generated from electrical resistance at points of contact between the materials serves to bond the materials together. By positioning the end parts 1*c* of the conducting wire on the inner side of the outermost circumferential part of the coil-shaped end faces, as described above, positioning of the electrodes for spot welding and the welding process is simplified.

Soldering is another method for establishing electrical connections. Recently, various types of lead-free solder have appeared on the market in consideration for the environment. However, the melting points of soldering materials vary depending on the type of material, and solder with a high melting point must be used for fine copper conducting wire that has been covered with an insulated film resistant to high temperatures as a single unit in order to support many types of mounting circuit boards for which the type of solder is not specified. A metal plating process can be performed when solder to be used on the electrodes (terminals) of the coil filter is not specified due to reasons on the electronic circuit board end, for example. Naturally, a flux process may also be performed to improve wettability of the solder.

Parts used in chip mounting, referred to by the classifications 1608, 1005, and the like, are substantially fixed in length and width, and the coil filter of the present invention is no exception. However, while a normal induction coil can only be set in one-turn units, the short ring parts in the coil filter according to the present invention can be set to a desired length or number of windings from a minimum of one turn to a predetermined maximum number of turns, even when the overall length or number of windings is fixed. Hence, the present invention can provide a coil filter having desired characteristics that can be made to change almost linearly.

Figure 2A:
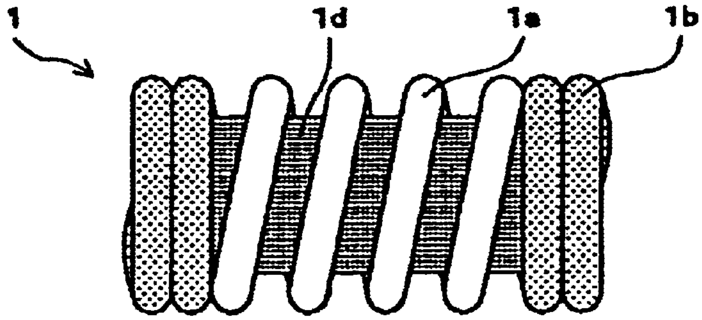
FIG. 2(*a*) is a front view of the coil filter showing a core material inserted into the coil filter of FIG. 1.
Figure 2B:
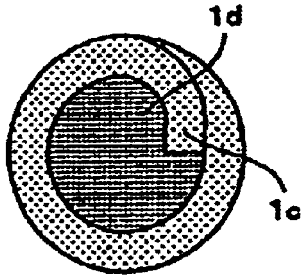

FIG. 2 is a schematic view showing a core material inserted in the coil filter of FIG. 1.

FIG. 2(*a*) is a front view and FIG. 2(*b*) is a side view of the coil filter 1. As in the example of FIG. 1, a conducting wire of a thickness suitable for the intended use is wound in a coil shape, while maintaining a fixed pitch in the center part of the coil filter, so that adjacent conducting wires 1*a* are electrically insulated. Short rings for blocking magnetic flux in the coil are constructed on both end parts 1*b* by electrically coupling the conducting wire.

While the coil filter of FIG. 1 is coreless, a core material 1*d* formed of a magnetic material including ferrite is inserted into the coil of FIG. 2. After inserting the core material, the end parts 1*c* of the conducting wire are positioned on the inner side of the outermost circumferential part of the coil-shaped end faces. While not shown in the drawings, a reliable electrical connection is formed to fix the end parts 1*c* through spot welding, laser soldering, or another process. Further, by positioning the end parts 1*c* inside of the outer portion of the coil shape, the core material 1*d* cannot fall out of the coil, thus eliminating the need for a special technique to prevent the core material from falling out of the coil, such as forming the inner diameter of the coil equal to the outer diameter of the core material or forming the outer diameter of the core material slightly larger and forcefully inserting the material into the coil, which techniques are used in conventional coils.

With regard to changes in the coil shape caused by temperature changes, linear expansion is dominant in the wound conducting wire, and the inner diameter of the coil is affected very little by temperature changes because the coil possesses hardness and spring-back ability.

With conventional devices in which a conducting wire is wound directly around a ferrite core or the like or in which a core material having an outer diameter larger than the inner diameter of the wound coil is forcefully inserted to prevent the core material from falling out, the diameter of the coil changes when the core material expands, thereby changing the characteristics of the coil.

Therefore, after winding the conducting wire into a coil shape, a core material such as a ferrite core having an outer diameter equivalent to or smaller than the inner diameter of the coil is inserted into the coil. Subsequently, a manufacturing method is used to position the ends of the conducting wire on the inner side of the outer parts of the coil shape to prevent the core material from falling out of the coil. In this way, a coil filter whose properties are relatively unaffected by temperature changes can be formed.

When the ferrite core is inserted into the coil, the effect of the short rings in interrupting magnetic flux is exhibited when the core is maintained inside the short ring parts on both ends of the coil. However, if the core material protrudes outside of the short rings, magnetic flux can leak out via the core material, thereby not only diminishing the effect of the filter, but also affecting parts positioned around the periphery. The characteristics of the coil may also change due to the influence of peripheral parts and interconnect patterns on the mounting substrate.

Instead of inserting a core material formed of a magnetic material inside the coil shape, it is possible to insert a glass rod, a plastic rod, a ceramic rod, a resistive element (MELF-type electrical resistor), or another metal material according to the intended application. For example, when a plurality of combined coil filters according to the present invention are inserted into a plastic package to form an integrated filter, changes in the overall properties of the package can be reduced by using the same type of plastic as the packaging in a rod-shaped core, thus enabling the assembly of coil filters with known characteristics as single units that can be integrated to construct a filter whose properties fluctuate very little.

Ferrite bead inductors, which have conventionally been used as EMI filters, reduce stray capacitance through a simple construction in which the inductor is inserted through a feed-through terminal in a ferrite core and enable noise to be converted into heat and absorbed when a ferrite material is selected. In these inductors, the resistance component inside the filter is dominant in the high-frequency range, while the inductance component is dominant in the low-frequency range. Chip-type ferrite bead inductors supporting surface mounting include layered types that have winding or straight conducting patterns formed in ferrite and types formed of an integrated external metal plate electrode and internal conducting part interposed between ferrite.

In place of this ferrite bead inductor, the coil filter according to the present invention combines a magnetic material as the inserted core with such specifications as the diameter of the coil wire, the number of windings, and the pitch of the windings to obtain isolation characteristics based on the objective or application or the required isolation characteristics. Due to the low DC resistance, this coil filter is suitable for power source applications.

Figure 3A:
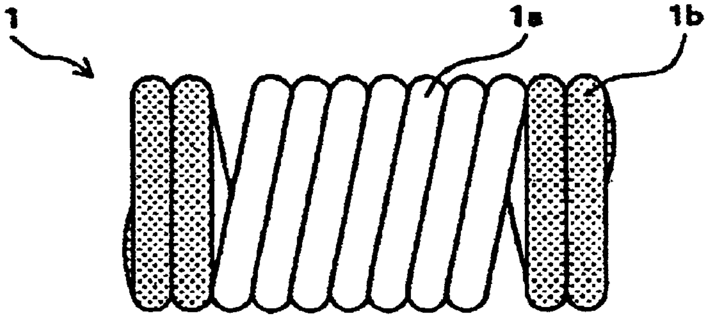
FIG. 3(*a*) is a front view of the coil filter showing the shape of a coil filter according to a second embodiment of the present invention.
Figure 3B:
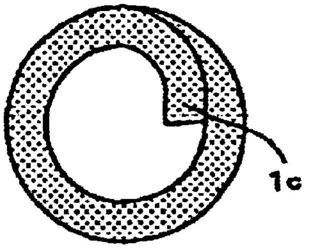

FIG. 3 is a schematic view showing the shape of a coil filter according to a second embodiment of the present invention.

FIG. 3(*a*) shows a front view and FIG. 3(*b*) shows a side view of the coil filter 1. A conducting wire of a thickness suitable for the intended application is wound in a coil shape, with the center part of the conducting wire wound tightly together. The conducting wire in the center part is covered with an insulating coating to electrically insulate adjacent conducting wires 1*a*. The insulating coating is stripped off of end parts 1*b*, and short rings for interrupting magnetic flux in the coil are constructed by electrically bonding the adjacent conducting wires in the end parts 1*b* through a soldering process, a metal plating process, or the like. End parts 1*c* of the conducting wire are positioned on the inner side of the outermost circumferential part of the coil-shaped end faces, as described in FIG. 1. While not shown in the drawings, the electrical connection of the end parts 1*c* are secured prior to mounting by performing a spot welding, laser soldering, or other bonding process in order to construct reliable short rings.

When the conducting wire is wound tightly together, the operational frequency range decreases due not only to the available capacitance between short rings, but also the available capacitance between conducting wires, but inductance can be increased over that of the coil wound at a pitch shown in FIG. 1, and isolation characteristics can be improved in the operational frequency band by combining inductors (L) and capacitors (C). The inductance value can be further increased by winding the conducting wire in the center part in multiple or multilayer coils, forming a filter that can be used in lower frequency ranges.

Figure 4:
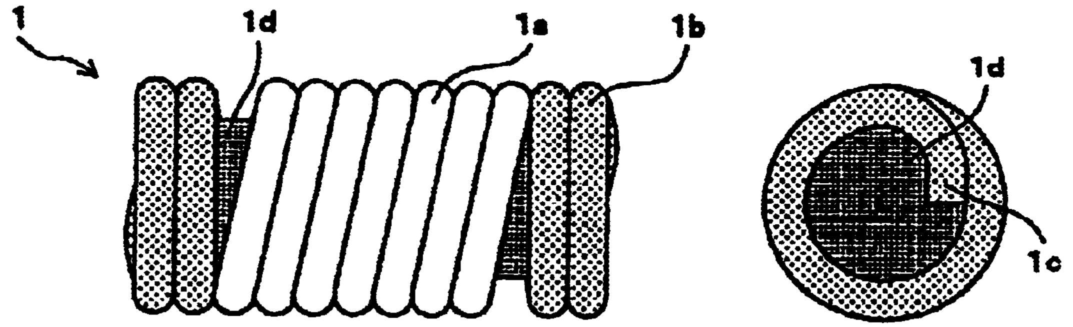
FIG. 4(*a*) is a front view of the coil filter showing a core material inserted into the coil filter of FIG. 3.

FIG. 4 is a schematic view showing a core material inserted in the coil filter of FIG. 3.

FIG. 4(*a*) is a front view and FIG. 4(*b*) is a side view of the coil filter 1. As in the example of FIG. 3, a conducting wire of a thickness suitable for the intended application is wound in a coil shape, with the center part of the conducting wire wound tightly together. The conducting wire in the center part is covered with an insulating coating to electrically insulate adjacent conducting wires 1*a*. The insulating coating is stripped off of the end parts 1*b*, and short rings for interrupting magnetic flux in the coil are constructed by electrically bonding the adjacent conducting wires in the end parts 1*b* by a soldering process, a metal plating process, or the like.

While the coil filter of FIG. 3 is coreless, a core material 1*d* formed of a magnetic material including ferrite is inserted into the coil of FIG. 4. After inserting the core material 1*d*, the end parts 1*c* of the conducting wire are positioned on the inner side of the outermost circumferential part of the coil-shaped end faces, as in the example of FIG. 2. A reliable electrical connection is formed to fix the end parts 1*c* through spot welding, laser soldering, or another process. By positioning the end parts 1*c* inside of the outer portion of the coil shape, the core material 1*d* cannot fall out of the coil.

As in the description of FIG. 2, broadband isolation characteristics based on the objective or application or on the required isolation characteristics can be obtained by combining a magnetic material for the inserted core with such specifications as the number of coil windings. Further, isolation characteristics of the filter can be improved by using a litz wire, formed of fine conducting wires twisted together, as the conducting wire. When ferrite is inserted, in particular, isolation characteristics improve considerably in the frequency band in which the effects of ferrite are demonstrated.

When forming short rings with the litz wire, it is difficult to short all of the plurality of combined insulated copper wires. Hence, while not shown in the drawings, a conductor ring is formed on both ends of the ferrite core material and spot welded at a plurality of locations on the conducting ring. Since the litz wire includes a plurality of copper wires twisted together, the insulating layer is always stripped from some place on the plurality of wires, enabling all wires to be connected to the short ring formed from the conducting ring.

Figure 5:
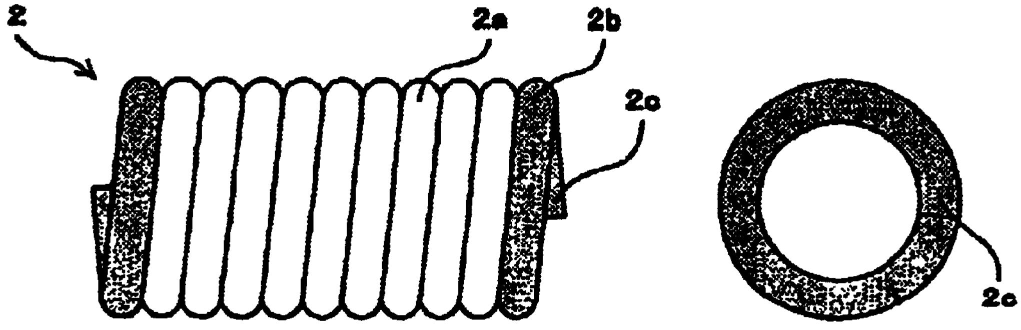
FIG. 5(*a*) is a front view of the inductor showing the share of an inductor configured of a conventional air-core coil.

FIG. 5 is a schematic view showing the construction of an inductor configured of a conventional air-core coil.

FIG. 5(*a*) is a front view and FIG. 5(*b*) is a side view of the inductor 2. A conducting wire of an appropriate thickness is wound in a coil shape, with the center part of the conducting wire wound tightly together. The conducting wire is covered with an insulating coating, such that adjacent conducting wires 2*a* are electrically insulated from each other. The insulating coating on two end parts 2*b* are stripped from the conducting wire, and the bare wires are subjected to a soldering process or the like.

With a inductor of this conventional shape shown in FIG. 5, end parts 2*c* are simply cut. If a plastic embossed tape is used in the automatic mounter, edges on the cut surface of the conducting wire in areas on both end faces of the coil catch on the inner surface of the plastic embossed tape when transported by a tape and reel or the like, thereby decreasing mounting efficiency.

Figure 6:
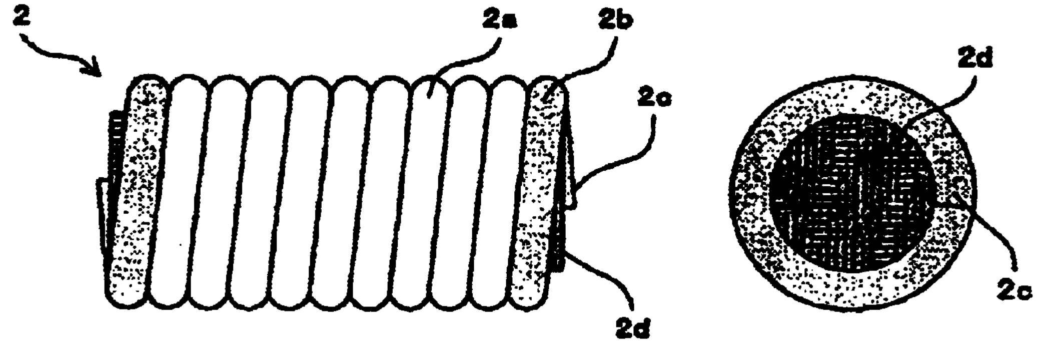
FIG. 6(*a*) is a front view showing the inductor showing the shave of an inductor configured of a conventional coil with an inserted core material.

FIG. 6 is a schematic view showing the construction of an inductor configured of a conventional coil with an inserted core material.

FIG. 6(*a*) is a front view and FIG. 6(*b*) is a side view showing the inductor 2. As with the inductor in FIG. 5, a conducting wire of an appropriate thickness is wound in a coil shape, with the center part of the conducting wire wound tightly together. The conducting wire is covered with an insulating coating, such that adjacent conducting wires 2*a* are electrically insulated from each other. The insulating coating on two end parts 2*b* are stripped from the conducting wire, and the bare wires are subjected to a soldering process or the like. Further, a core material 2*d* formed of a magnetic material including ferrite is inserted inside the coil.

Figure 7:
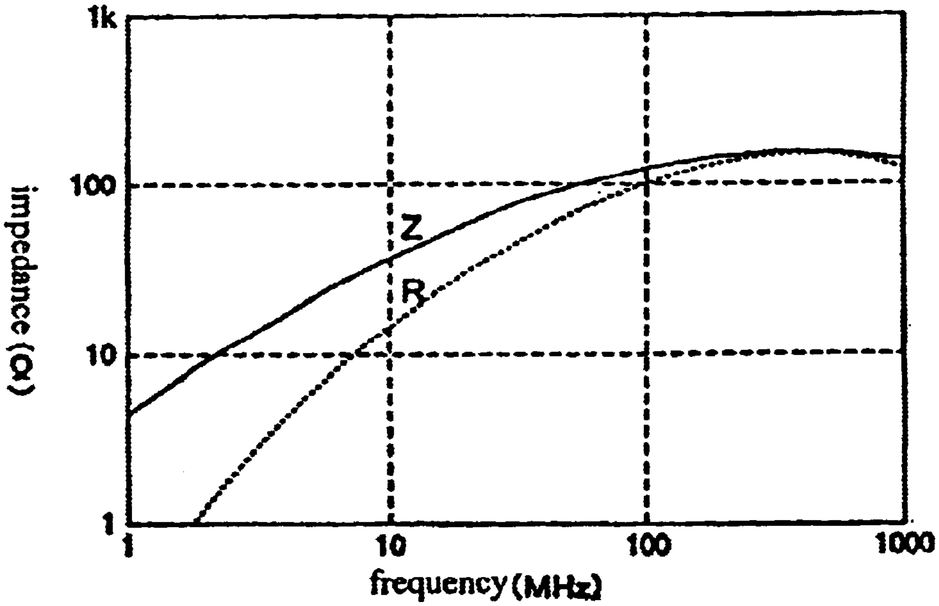
FIG. 7(*a*) shows the impedance characteristics of a common ferrite bead inductor showing the impedance characteristics of an inductor.
Figure 7B:
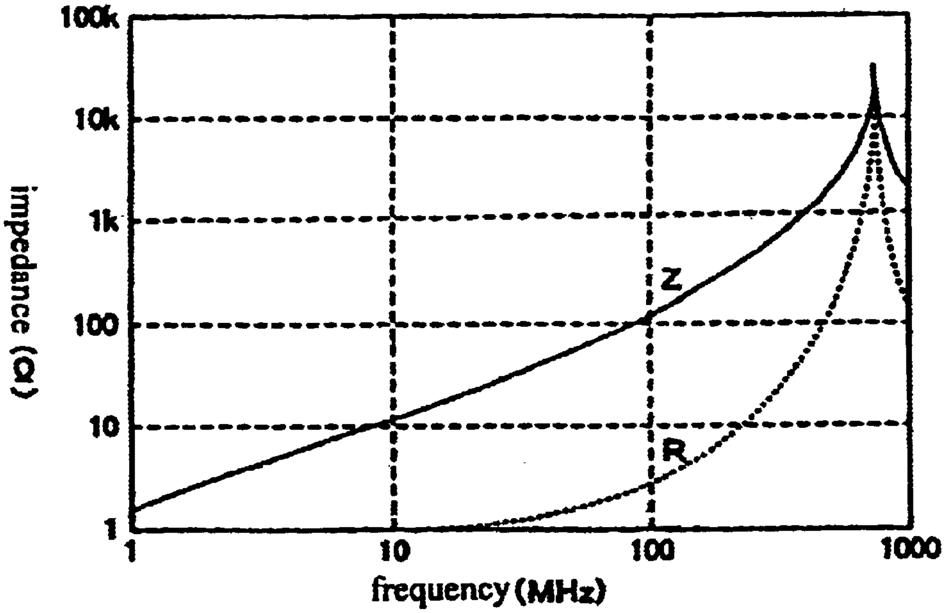

FIG. 7 is a graph showing the impedance characteristics of the inductor.

FIG. 7(*a*) shows the impedance characteristics of a common ferrite bead inductor, while FIG. 7(*b*) shows the impedance characteristics of an air-core coil commonly used in high-frequency filtering circuits. FIG. 7(*a*) shows that the R (resistance) component is dominant, and loss is high. FIG. 7(*b*) indicates that the R component is small, loss is also low, and thus the Q-value is high.

When used in place of the ferrite bead inductor of FIG. 7(*a*), the coil filter of the present invention can obtain isolation characteristics effective in the desired frequency band by selecting appropriate specifications for the diameter of the coil wire, number of windings, pitch of the windings, length of the short rings, magnetic core material inserted in the coil, and the like.

Figure 8:
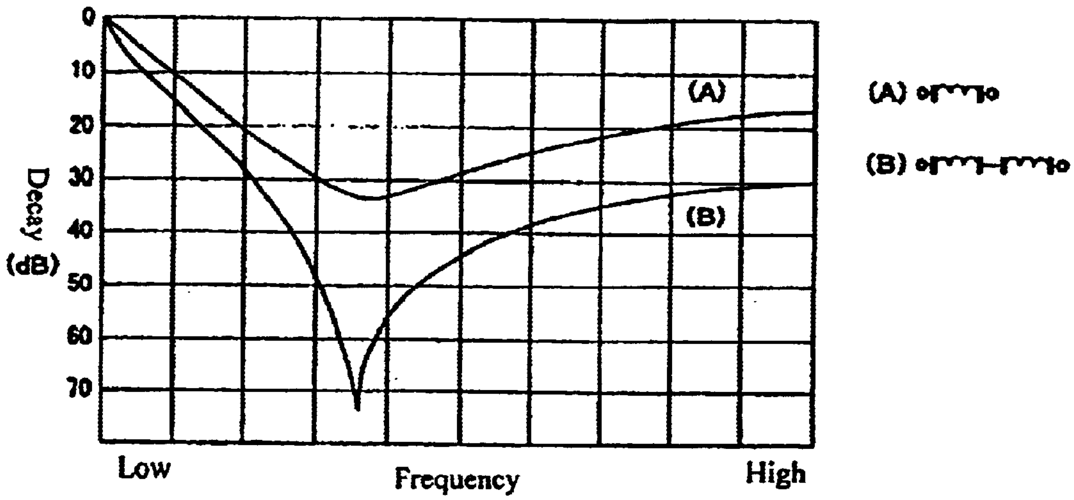
FIG. 8(*a*) is a graph showing the decay characteristics of a coil filter and an inductor the isolation (decay) characteristics for the coil filter of the present invention.
Figure 8:
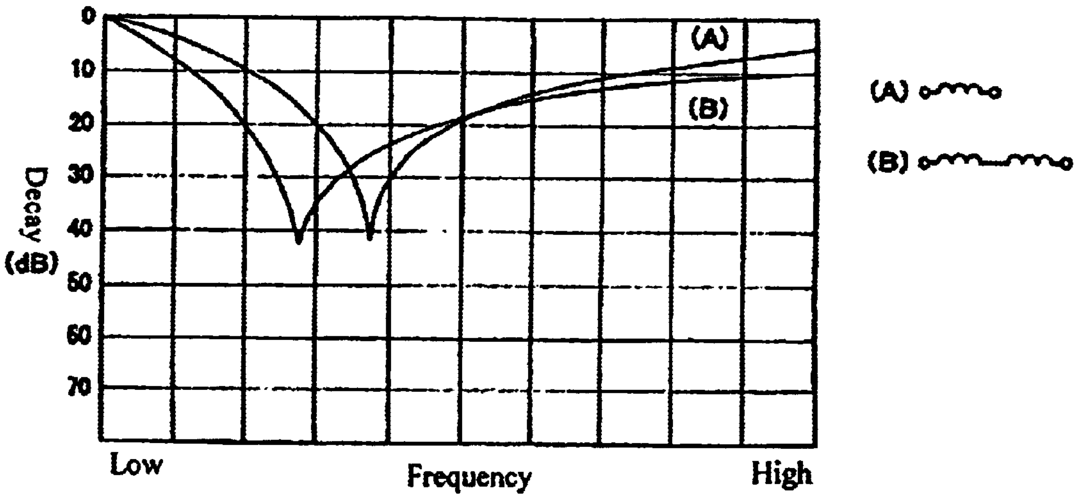

FIG. 8 is a graph showing the decay characteristics of the coil filter and inductor.

FIG. 8(*a*) shows the isolation (decay) characteristics for the coil filter of the present invention, while FIG. 8(*b*) shows the isolation characteristics for a common induction coil. In both diagrams, (A) indicates the frequency characteristics when using a single coil, while (B) indicates the frequency characteristics when two coils are connected in series in close proximity to each other.

When the common induction coils shown in FIG. 8(*b*) are connected in series through magnetic coupling (B), the self-resonance point generated from inter-winding capacitance and the like shifts lower, but there are almost no improvements in isolation.

In the coil filter of the present invention shown in FIG. 8(*a*), the short rings lower the Q-value, while a high isolation is maintained across a wide bandwidth. When coil filters are connected in series, the degree of magnetic coupling is reduced by the short rings. Hence, there is almost no shift in the resonance frequency, while an even higher isolation is obtained.

Figure 9:
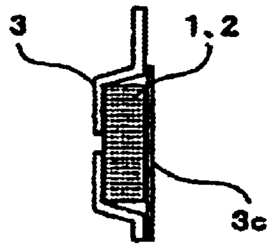
FIG. 9*a* is a side cross-sectional view showing the shape of an automatic mounting embossed carrier.
FIG. 9*b* is a front view of a tape and reel.
Figure 9:
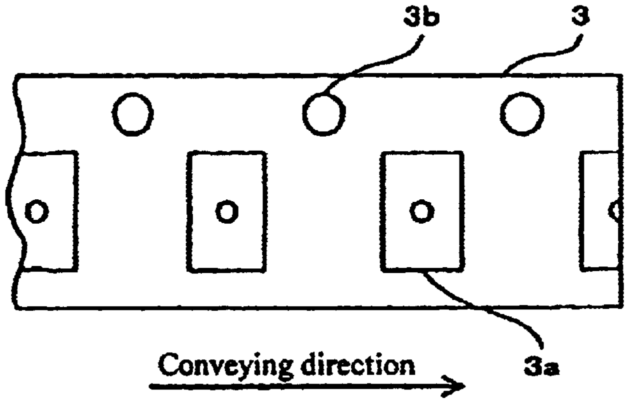

FIG. 9 is a schematic view showing the construction of an embossed carrier for automatic mounting.

FIG. 9(*b*) is a front view of a tape and reel, while FIG. 9(*a*) is a side cross-sectional view showing how the parts 1 and 2 are mounted. A tape 3 includes cavities 3*a* (embossed parts) for mounting the parts, circular holes 3*b* for feeding the tape, and a film-like sheet 3*c* affixed to prevent the parts 1 and 2 from falling out of the cavities 3*a*. The sheet 3*c* is peeled back when mounting parts.

Since the end parts of the conducting wire are positioned on the inner side of the outermost circumferential part of the coil-shaped end faces, the coil filter of the present invention improves mounting efficiency because the edges of the cut faces on the conducting wire do not catch on the inner surface of the plastic embossed tape when using an embossed carrier tape in an automatic mounter.

In recent years, bulk mounting has been replacing conventional tape and reels. While not shown in the drawings, bulk mounting uses a bulk feeder or the like to arrange randomly ordered chip parts in a line and to supply the aligned chip parts to a chip mounter for mounting and is thought, from a natural resources and environmental perspective, to be a future trend that will replace conventional apparatuses using paper tape or other packaging materials. Further, bulk mounting can reduce the amount of required storage space and can also lead to a reduction in expended transport energy.

Since conventional wound-type induction coils cannot be disposed around the entire periphery of a terminal (electrode), current methods change the shape of the inductor to a substantially square shape, fix the top-to-bottom orientation and the like, and support automatic mounting by rotating a square bobbin or the like. However, the coil filter according to the present invention can also be thought applicable from the perspective of bulk packaging since the coil filters can be formed in cylindrical shapes having no top or bottom, polarity, or protruding parts.

The cylindrical shape is advantageous in that it is possible to employ a bulk feeder that does not require a motor or the like, but uses the force of gravity.

INDUSTRIAL APPLICABILITY

As described above, the present invention provides a coil filter for blocking electromagnetic waves or high-frequency signals propagating while being superimposed on a DC power supply, signal, or the like of an electronic apparatus such as an electronic circuit board, wherein conducting wires are bonded electrically at coil end parts such that a conducting wire part wound by one turn or more constitutes a short ring conducting in a ring shape on both sides of an intermediate part in which electrically insulated conducting wires are wound, and end parts of the conducting wire are positioned on the inner side of the outermost circumferential part of the coil-shaped end faces. Accordingly, the present invention achieves a filter with isolation effects in a broad band range, owing to the short rings, with little effects from the mutual positioning of parts. Further, by positioning the end parts of the conducting wire on the inner side of the coil end faces, yield rates in an automatic mounter can be improved.

Further, by winding the conducting wire in the intermediate part in a multiple or multilayer coil shape, it is possible to produce a filter with characteristics that can be applied to a lower frequency range, while maintaining the same outer dimensions.

Further, since the conducting wire part of the coil end parts constitutes a short ring in which conducting wires are electrically bonded by soldering or welding, characteristics can be reliably maintained by the short rings.

Further, an insulating coating is formed over the conducting wire among the adjacent conducting wires in the intermediate part; and the coil end parts constituting the short ring are subjected to a plating process by solder or metal. Accordingly, inductance values can be increased by the tight windings, while mounting on a circuit board is facilitated by the soldering or metal plating process.

Further, since the short ring parts of the coil end parts are set to a desired number of turns greater than or equal to one turn and within a maximum number of turns to obtain desired characteristics, it is possible to select a coil filter suitable for the mounting circuit board.

Further, since the external shape of the coiled conducting wire including electrode parts configuring the short rings is formed cylindrical in shape to facilitate mounting on an electronic circuit board or the like, the coil filters can be used in bulk mounting.

Further, since a core material formed of a magnetic material or a rod-shaped core is disposed inside the coiled conducting wire, isolation characteristics in a frequency range matching the mounting circuit board can be selected by selecting an appropriate core material.

Further, the end parts of the conducting wire are positioned on the inner side of the outermost circumferential part of the coil shape, such that the core material formed of magnetic material or the rod-shaped core disposed inside the coiled conducting wire does not fall out. Accordingly, the initial characteristics of the filter can be maintained without requiring special work to be performed on the coil shape or the core material.

Further, since a core material formed of a magnetic material is disposed inside the short ring parts configured on the coil end parts, magnetic flux is less likely to leak, and the effects of neighboring parts, the circuit board, and the like on the filter characteristics are suppressed.

Further, isolation characteristics are improved when a litz wire having a plurality of conducting wires covered with individual insulating coatings and twisted together is used as the coiled conducting wire.

Further, all wires in the litz wire can be connected to the short ring when a core material formed of a magnetic material or a rod-shaped core is disposed inside the coil shape formed by the litz wire, and when a short ring is configured by welding end parts of the litz wire at a plurality of locations to a conducting ring formed on both end parts of the core material.

Further, the conducting wire is wound in a coil shape, and subsequently a core material formed of a magnetic material or a rod-shaped core having an outer diameter equivalent to or smaller than the inner diameter of the coil is inserted into the coil. Accordingly, the present invention can achieve filter characteristics affected little by changes in temperature.

What is claimed is:

1. A coil filter for blocking electromagnetic waves or high-frequency signals propagating while being superimposed on an electronic apparatus, comprising:

a conducting wire having coil end parts and a conducting wire part therebetween bonded electrically at said coil end parts by soldering or welding such that said conducting wire part wound by one turn or more constitutes a short ring conducting in a ring shape on both sides of an intermediate part wherein said intermediate part includes said conducting wire which is wound and insulated and both ends of said conducting wire are positioned so that they do not protrude from the coil in the axial direction with reference to the rotational axis of a cylindrical coil for improving mounting efficiency with an automatic mounter.

2. A coil filter according to claim 1, wherein the conducting wire in the intermediate part is wound in a multiple or multilayer coil shape.

3. The coil filter according to claim 1, wherein an insulating coating is formed over the conducting wire among the adjacent conducting wires in the intermediate part; and the coil end parts constituting the short ring are subjected to a plating process by solder or metal corresponding to a desired mounting circuit board.

4. The coil filter according to claim 1 configured to obtain desired characteristics by setting the short ring part of the coil end parts to a desired number of turns greater than or equal to one turn and within a maximum number of turns.

5. The coil filter according to claim 1, wherein the external shape of the coiled conducting wire including electrode parts configuring the short rings is formed cylindrical in shape to facilitate mounting on an electronic circuit board.

6. The coil filter according to claim 1, wherein a core material formed of a magnetic material or a rod-shaped core is disposed inside the coiled conducting wire; and the core material or the rod-shaped core is disposed inside the short ring parts configured on the coil end parts.

7. The coil filter according to claim 6, wherein the end parts of the conducting wire are positioned on the inner side of the outermost circumferential part of the coil shape, such that the core material formed of magnetic material or the rod-shaped core disposed inside the coiled conducting wire does not fall out.

8. The coil filter according to claim 1, wherein the coiled conducting wire is configured of a litz wire in which a plurality of conducting wires covered with individual insulating coatings are twisted together in order to improve isolation characteristics.

9. The coil filter according to claim 8, wherein a core material formed of a magnetic material or a rod-shaped core is disposed inside the coil shape formed by the litz wire; and a short ring is configured by welding end parts of the litz wire at a plurality of locations to a conducting ring formed on both end parts of the core material.

10. A method for manufacturing the coil filter according to claim 6, whereby the conducting wire is wound in the shape coil shape, and subsequently a core material formed of a magnetic material or a rod-shaped core having an outer diameter equivalent to or smaller than the inner diameter of the coil is inserted into the coil.

11. The coil filter according to claim 2, wherein an insulating coating is formed over the conducting wire among the adjacent conducting wires in the intermediate part; and the coil end parts constituting the short ring are subjected to a plating process by solder or metal corresponding to a desired mounting circuit board.

12. The coil filter according to claim 2 configured to obtain desired characteristics by setting the short ring part of the coil end parts to a desired number of turns greater than or equal to one turn and within a maximum number of turns.

13. The coil filter according to claim 3 configured to obtain desired characteristics by setting the short ring part of the coil end parts to a desired number of turns greater than or equal to one turn and within a maximum number of turns.

14. The coil filter according to claim 3, wherein the external shape of the coiled conducting wire including electrode parts configuring the short rings is formed cylindrical in shape to facilitate mounting on an electronic circuit board.

15. The coil filter according to claim 3, wherein a core material formed of a magnetic material or a rod-shaped core is disposed inside the coiled conducting wire; and the core material or the rod-shaped core is disposed inside the short ring parts configured on the coil end parts.

16. The coil filter according to claim 5, wherein a core material formed of a magnetic material or a rod-shaped core is disposed inside the coiled conducting wire; and the core material or the rod-shaped core is disposed inside the short ring parts configured on the coil end parts.

17. The coil filter according to claim 3, wherein the coiled conducting wire is configured of a litz wire in which a plurality of conducting wires covered with individual insulating coatings are twisted together in order to improve isolation characteristics.

18. The coil filter according to claim 6, wherein the coiled conducting wire is configured of a litz wire in which a plurality of conducting wires covered with individual insulating coatings are twisted together in order to improve isolation characteristics.

19. The coil filter according to claim 1, wherein the electronic apparatus is an electronic circuit board.

* * * * *